United States Patent
Pan

(10) Patent No.: US 7,170,139 B2
(45) Date of Patent: Jan. 30, 2007

(54) SEMICONDUCTOR CONSTRUCTIONS

(75) Inventor: Pai-Hung Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 11/025,142

(22) Filed: Dec. 28, 2004

(65) Prior Publication Data

US 2005/0111248 A1  May 26, 2005

Related U.S. Application Data

(63) Continuation of application No. 09/059,644, filed on Apr. 13, 1998, now Pat. No. 6,844,252, which is a continuation of application No. 08/710,353, filed on Sep. 17, 1996, now Pat. No. 5,739,066.

(51) Int. Cl.
*H01L 29/76* (2006.01)

(52) U.S. Cl. .................................. 257/412; 257/388

(58) Field of Classification Search ................ 438/595; 257/413, 412, 388, 383
See application file for complete search history.

(56) References Cited

U.S. PATENT DOCUMENTS

| | | | |
|---|---|---|---|
| 4,599,118 A | 7/1986 | Han et al. | |
| 4,786,609 A | 11/1988 | Chen | |
| 4,954,867 A | 9/1990 | Hosaka | |
| 4,971,655 A | 11/1990 | Stefano | |
| 4,981,810 A | 1/1991 | Fazan et al. | |
| 5,015,598 A | 5/1991 | Verhaar | |
| 5,126,283 A | 6/1992 | Pintchovski | |

(Continued)

FOREIGN PATENT DOCUMENTS

JP         58-25265        5/1983

(Continued)

OTHER PUBLICATIONS

Wolf et al., Silicon Processing for the VLSI Era, pp. 66-71 (1996).

(Continued)

*Primary Examiner*—Michael Trinh
(74) *Attorney, Agent, or Firm*—Wells St. John P.S.

(57) ABSTRACT

A semiconductor processing method of forming a conductive gate or gate line over a substrate includes, a) forming a conductive gate over a gate dielectric layer on a substrate, the gate having sidewalls and an interface with the gate dielectric layer; b) electrically insulating the gate sidewalls; and c) after electrically insulating the gate sidewalls, exposing the substrate to oxidizing conditions effective to oxidize at least a portion of the gate interface with the gate dielectric layer. According to one aspect of the invention, the step of exposing the substrate to oxidizing conditions is conducted after provision of a first insulating material and subsequent anisotropic etch thereof to insulate the gate sidewalls. According to another aspect of the invention, the step of exposing the substrate to oxidizing conditions is conducted after provision of first and second insulating materials and subsequent anisotropic etch thereof to insulate the gate sidewalls. According to another aspect of the invention, the step of exposing the substrate to oxidizing conditions is conducted after provision and subsequent anisotropic etch of a first insulating material, followed by provision and subsequent anisotropic etch of a second insulating material.

12 Claims, 4 Drawing Sheets

U.S. PATENT DOCUMENTS

| | | | |
|---|---|---|---|
| 5,153,145 A * | 10/1992 | Lee et al. ............... 438/305 |
| 5,219,777 A | 6/1993 | Kang |
| 5,262,352 A | 11/1993 | Woo et al. |
| 5,286,344 A | 2/1994 | Blalock |
| 5,290,720 A | 3/1994 | Chen |
| 5,306,655 A | 4/1994 | Kurimoto |
| 5,306,951 A | 4/1994 | Lee et al. |
| 5,314,834 A | 5/1994 | Mazure et al. |
| 5,322,807 A | 6/1994 | Chen et al. |
| 5,334,556 A | 8/1994 | Guldi |
| 5,371,026 A | 12/1994 | Hayden |
| 5,382,533 A | 1/1995 | Ahmad et al. |
| 5,420,800 A | 5/1995 | Fakui |
| 5,422,289 A | 6/1995 | Pierce |
| 5,430,313 A | 7/1995 | Kumagai et al. |
| 5,439,846 A | 8/1995 | Nguyen et al. |
| 5,476,802 A | 12/1995 | Yamazaki |
| 5,491,100 A | 2/1996 | Lee et al. |
| 5,512,771 A | 4/1996 | Hiroki et al. |
| 5,545,578 A | 8/1996 | Park et al. |
| 5,552,329 A | 9/1996 | Kim et al. |
| 5,552,332 A | 9/1996 | Tseng |
| 5,637,514 A | 6/1997 | Jeng |
| 5,668,028 A | 9/1997 | Bryant |
| 5,682,055 A | 10/1997 | Huang et al. |
| 5,714,413 A | 2/1998 | Brigham et al. |
| 5,739,066 A | 4/1998 | Pan |
| 5,759,901 A | 6/1998 | Loh et al. |
| 5,798,279 A | 8/1998 | Crisenza et al. |
| 5,897,353 A | 4/1999 | Kim et al. |
| 5,903,053 A | 5/1999 | Iijima et al. |
| 5,994,192 A | 11/1999 | Chen |
| 6,037,228 A | 3/2000 | Hsu |
| 6,040,241 A | 3/2000 | Lee et al. |
| 6,143,611 A | 11/2000 | Gilton et al. |
| 6,365,497 B1 | 4/2002 | Gonzalez |
| 6,372,618 B2 | 4/2002 | Forbes et al. |
| 6,576,939 B1 | 6/2003 | Gilton et al. |

FOREIGN PATENT DOCUMENTS

| | | |
|---|---|---|
| JP | 62-90974 | 9/1987 |
| JP | 64-73772 | 3/1989 |

OTHER PUBLICATIONS

Wolf et al., Silicon Processing for the VLSI Era, pp. 208 and 212 (1986).

Wolf et al., Silicon Processing for the VLSI Era, pp. 216-218 (1986).

* cited by examiner

SEMICONDUCTOR CONSTRUCTIONS

RELATED PATENT DATA

This patent resulted from a continuation application of U.S. patent application Ser. No. 09/059,644, filed Apr. 13, 1998, now U.S. Pat. No. 6,844,252, which is a continuation of U.S. patent application Ser. No. 08/710,353, filed Sep. 17, 1996, now U.S. Pat. No. 5,739,066.

TECHNICAL FIELD

This invention relates to semiconductor processing methods of forming a conductive gate line.

BACKGROUND OF THE INVENTION

Metal Oxide Semiconductor (MOS) devices find use in integrated circuit memory devices such as static random access memory (SRAM) and dynamic random access memory (DRAM) devices. Such devices inevitably include conductive lines connecting one or more of the devices together. One type of conductive line is a gate or word line. Word lines connect the gates of one or more MOS devices together so that when the word line is turned on, data in the form of stored charges can be accessed.

It is desirable that a word line be highly conductive. A great deal of effort has gone into engineering more conductive word lines. Words lines are typically formed over a dielectric surface. The conventional word line includes at least one layer of conductive material which is layered onto the dielectric surface and then etched, typically anisotropically, to form a patterned word line, also referred to herein as a gate, gate line or gate stack. After anisotropically etching the gate or gate line, it is desirable to conduct a reoxidation step which helps to repair damage to the dielectric surface resulting from the anisotropic etch. Additionally, the reoxidation step oxidizes a portion of the gate or gate stack immediately adjacent the dielectric surface to round the lower portion of the conductive material, effectively creating a so-called "smiling gate" structure in which tiny bird's beak structures are formed at the bottom corners of the gate stack. Such smiling gate structure reduces hot electron degradation, as recognized by those of skill in the art.

During such reoxidation steps, it has been observed that the conductivity of the gate has been impaired due to the undesirable oxidation of the conductive materials forming the gate. For example, one type of conductive gate includes a conductive polysilicon layer atop the dielectric surface and a conductive layer of $WSi_x$ atop the polysilicon layer. A more conductive prior art word line is formed from a conductive layer of polysilicon, a conductive layer of metallic material, and an intervening conductive metallic barrier layer between the polysilicon and metallic material which prevents formation of silicide during subsequent processing. Unfortunately, during the reoxidation step, the conductive materials of the line experience appreciable oxidation which has led to higher resistances (lower conductivities). Additionally, such oxidation has led to degradation of the interface between the materials which, in turn, can cause the materials to peel away from one another and create a yield loss.

This invention grew out of the need to provide a conductive line and to reduce undesirable oxidation effects on the conductive line due to oxidation processing steps such as a source/drain oxidation.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a conductive transistor gate over a substrate comprises the steps of:

forming a conductive gate over a gate dielectric layer on a substrate, the gate having sidewalls and an interface with the gate dielectric layer;

forming nitride containing spacers over the gate sidewalls; and after forming the spacers, exposing the substrate to oxidizing conditions effective to oxidize at least a portion of the gate interface with the gate dielectric layer.

In accordance with another aspect of the invention, a semiconductor processing method of forming a conductive gate comprises the steps of:

forming a patterned gate atop a substrate dielectric surface, at least a portion of the gate being conductive;

covering the gate with oxidation resistant material; and exposing the substrate to oxidation conditions effective to oxidize at least a portion of the gate laterally adjacent the oxidation barriers In accordance with yet another aspect of the invention, a semiconductor processing method of forming a conductive transistor gate over a substrate comprises the steps of:

forming a conductive gate over a gate dielectric layer on a substrate, the gate having sidewalls;

forming non-oxide spacers over the sidewalls; and after forming the spacers, exposing the substrate to oxidizing conditions effective to oxidize at least a portion of the gate and a portion of the substrate beneath the gate.

Figure 1:
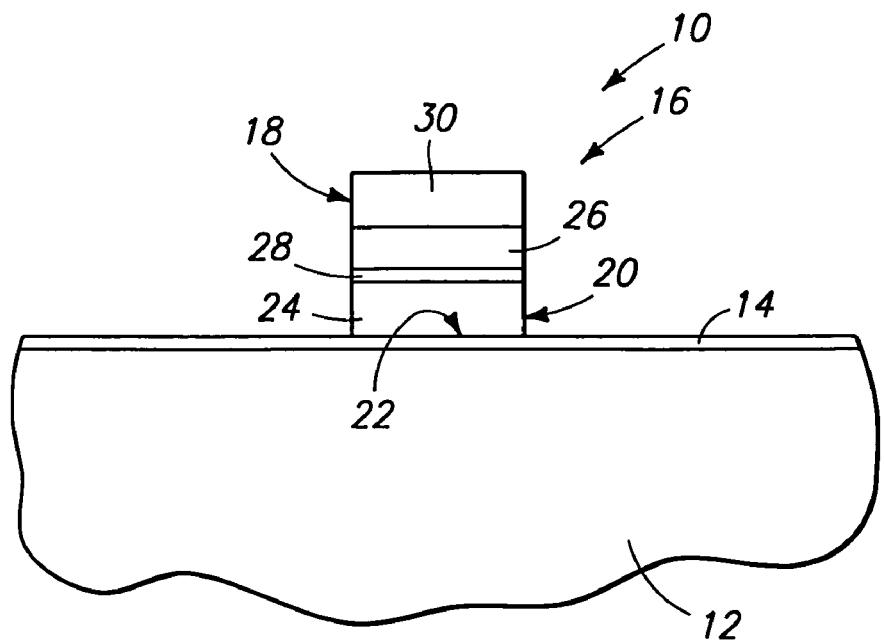
FIG. 1 is a diagrammatic representation of a fragment of a substrate processed in accordance with the invention.

More specifically and with reference to FIG. 1, a semiconductor wafer fragment in process is indicated generally by reference numeral 10. Such is comprised of a bulk substrate 12, preferably composed of monocrystalline silicon, and an overlying dielectric layer 14 in the form of a suitable gate oxide. Dielectric layer 14 defines a substrate dielectric surface atop which a patterned composite gate or gate stack 16 is formed, preferably by an anisotropic reactive ion etch. Gate stack 16 defines a field effect transistor gate line at least a portion of which is conductive. Gate stack 16 includes a pair of sidewalls 18, 20 and an interface 22 with gate dielectric layer 14. Gate stack 16 is a multi-layered structural composite which includes a plurality of layers. A first conductive layer 24 is preferably formed from polysilicon and includes a portion which defines interface 22. A metal layer 26 overlies layer 24 and is formed from a suitable metal such as tungsten (W), molybdenum (Mo) and the like. An electrically conductive reaction barrier layer 28 is preferably formed from a suitable material such as TiN, WN, and the like and is interposed between or intermediate layers 24 and 26. Layer 28 in the preferred embodiment prevents the formation of a silicide during subsequent processing steps. A cap 30 is formed atop overlying metal layer 26 from a suitable oxidation resistant material such as oxide/nitride, nitride, oxide/nitride/oxide, oxynitride, Si-rich nitride and the like, for protecting or shielding gate stack 16 during a subsequent oxidation step described in detail below. Accordingly, cap 30 is a nitride containing material which effectively protects or shields the top of the gate line as will become apparent below.

Figure 2:
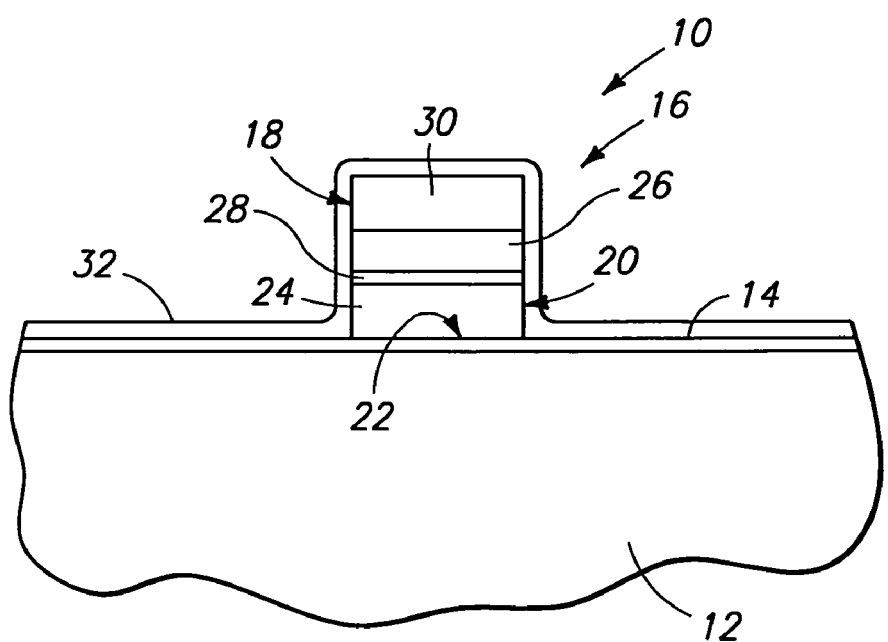
FIG. 2 is a view of the FIG. 1 substrate fragment at a processing step subsequent to that shown by FIG. 1.
Figure 3:
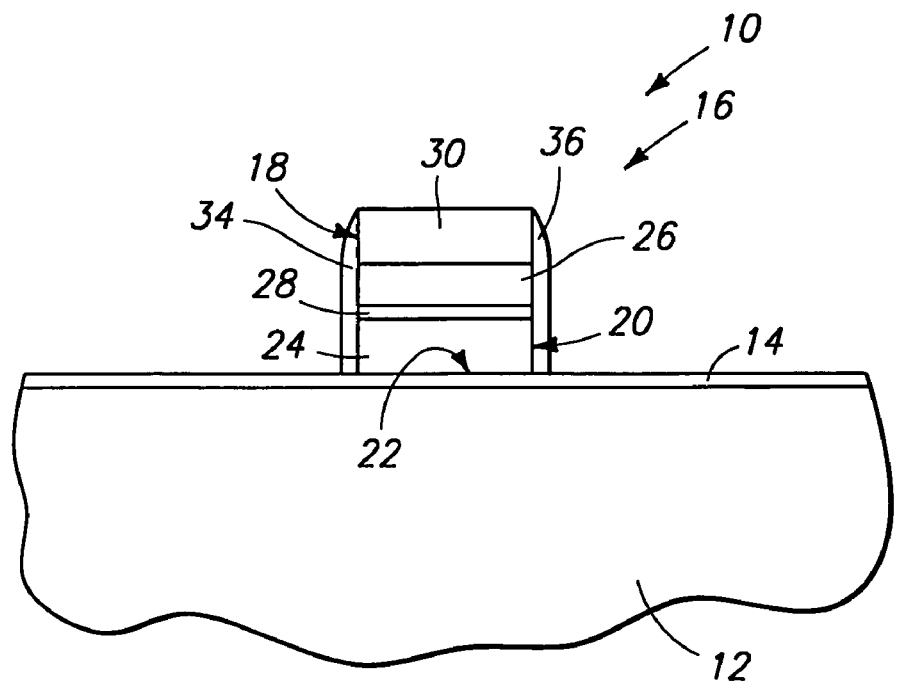
FIG. 3 is a view of the FIG. 1 substrate fragment at a processing step subsequent to that shown by FIG. 2.

Referring to FIGS. 2 and 3, first oxidation barriers are formed on gate stack 16 which cover at least the conductive portion of the gate stack. First oxidation barriers can be formed from nitride containing material and/or suitable non-oxide materials. More specifically, first oxidation barrier material 32, such as $Si_3N_4$ or $SiN_xO_y$, is deposited over gate stack 16 (FIG. 2) to a thickness ranging from between 50 to 500 Angstroms. Such can be deposited utilizing conventional techniques at deposition temperatures between 300° C.–900° C. A subsequent first anisotropic etch (FIG. 3) is conducted to a degree sufficient to leave first oxidation barriers 34, 36 on or proximate gate stack 16. Preferably, such etch is a reactive ion etch which is selective to oxide. Oxidation barriers 34, 36 preferably shield at least a portion of gate line sidewalls 18, 20 during subsequent processing, which includes a reoxidation step described below. For purposes of the ongoing discussion, first oxidation barrier material 32 comprises a first insulative or insulating material which is anisotropically etched to form electrically insulative or insulating spacers 34, 36 over gate line sidewalls 18, 20, respectively.

Figure 8:
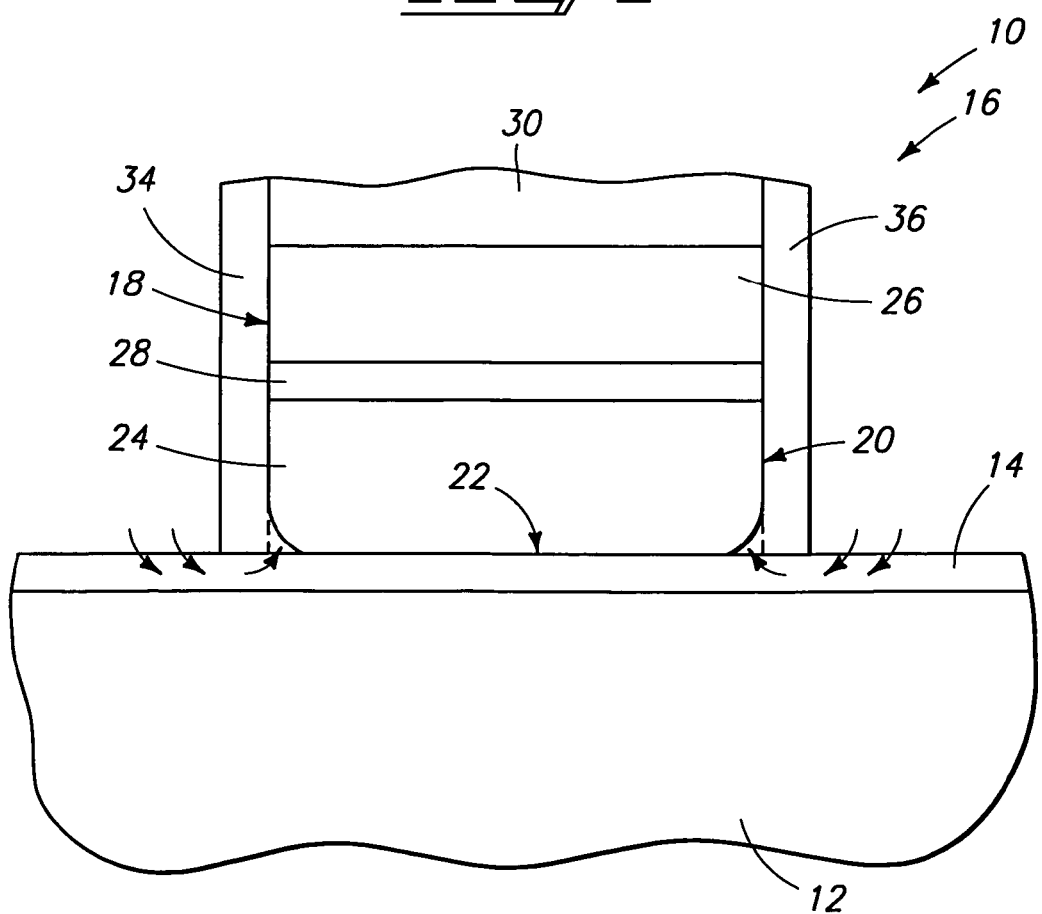
FIG. 8 is an enlarged view of a portion of the wafer fragment of FIG. 3 undergoing a smiling gate oxidation.

According to one preferred aspect of the invention, and after spacers or barriers 34, 36 are formed, the substrate is exposed to oxidizing conditions which are effective to reoxidize the substrate to repair damage to layer 14 resulting from the first etch, as well as to oxidize at least a portion of the gate or gate line interface 22 with dielectric layer 14. During such exposure cap 30 together with barriers 34, 36 effectively encapsulate or cover the gate thereby preferably shielding the gate top and desired portions of the gate sidewalls from the effects of oxidation. Suitable oxidizing conditions have been found to be those which are conducted at ambient temperatures in a range from between about 800° C. to 1050° C. for time periods which would be sufficient to grow an oxide layer over a separate semiconductor substrate to a thickness of around 80 Angstroms. Other oxidizing conditions are possible. Such oxidation is best seen in FIG. 8 which is an enlarged partial view of gate or gate stack 16. There, bottom corner portions of polysilicon layer 24 laterally adjacent spacers 34, 36 are suitably oxidized and thereby rounded to form a smiling gate. More specifically, oxidants indicated by the small arrows entering into and through gate dielectric layer 14 channel along and through dielectric layer 14. That is, layer 14 provides a channeling layer through which oxidants can travel to reach the gate or gate stack. Preferably during the smiling gate oxidation, the portion of gate stack 16 which is oxidized is disposed laterally adjacent and inwardly of barriers or spacers 34, 36 and forms a "bird's beak" structure immediately adjacent each respective spacer. By controlling the oxidation temperature and time as mentioned above, the oxidation will occur at preferred gate edge regions and will not appreciably propagate upwardly towards layers 26, 28.

The smiling gate oxidation step may, however, be conducted at processing points other than immediately following the formation of spacers 34, 36. Such is described by way of example immediately below.

Figure 4:
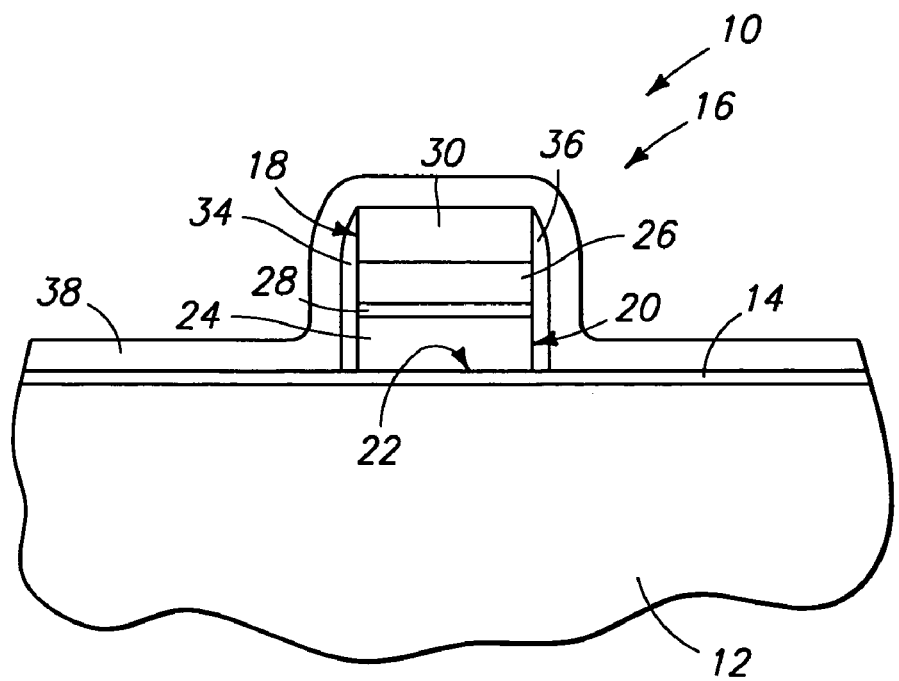
FIG. 4 is a view of the FIG. 1 substrate fragment at a processing step subsequent to that shown by FIG. 3.

Referring to FIG. 4, another preferred aspect of the invention is set forth in which the smiling gate oxidation step is conducted after a second barrier material 38 is deposited over substrate 12, and more specifically, deposited over barriers or spacers 34, 36 which are defined by first barrier material 32. Preferably, the second barrier material is a nitride containing and/or non-oxide material deposited to a thickness of 500 Angstroms. For purposes of the ongoing discussion, second barrier material 38 is a second oxidation resistant layer or an electrically insulating or insulative material.

Figure 5:
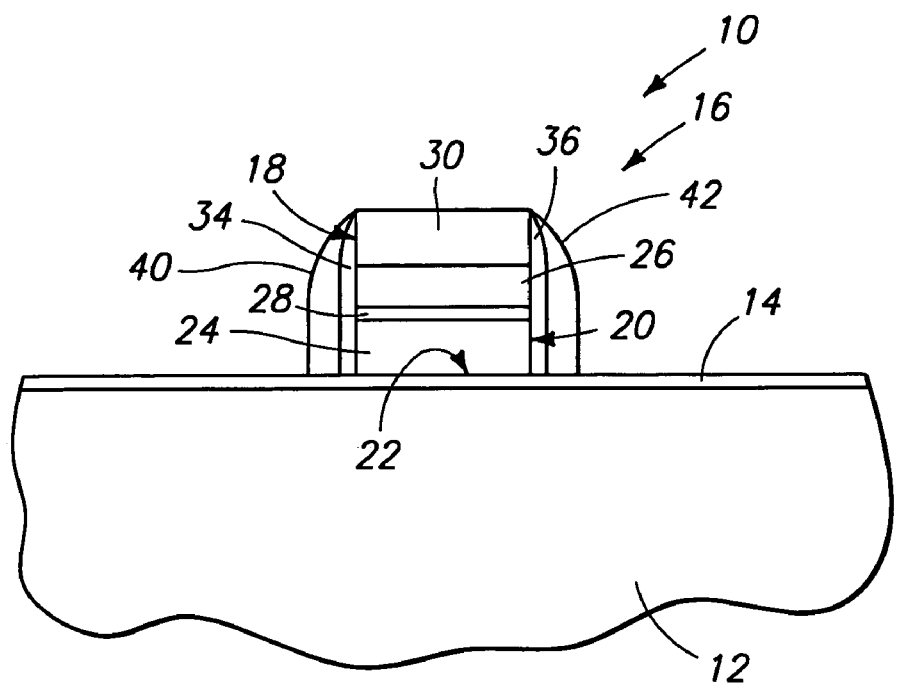
FIG. 5 is a view of the FIG. 1 substrate fragment at a processing step subsequent to that shown by FIG. 4.

Referring to FIG. 5, a second anisotropic etch, preferably a reactive ion etch of second barrier material 38 is conducted to a degree sufficient to leave second oxidation barriers 40, 42 over or proximate first oxidation barriers 34, 36 respectively. At this point, the smiling gate oxidation can take place to form the smiling gate as described above with reference to FIG. 8. The step of exposing the substrate to the oxidation conditions sufficient to form the smiling gate as described above, can take place prior to depositing second barrier material 38 and after the first anisotropic etch. Such step would take place in conjunction with gate stack 16 as shown in FIG. 3.

Figure 6:
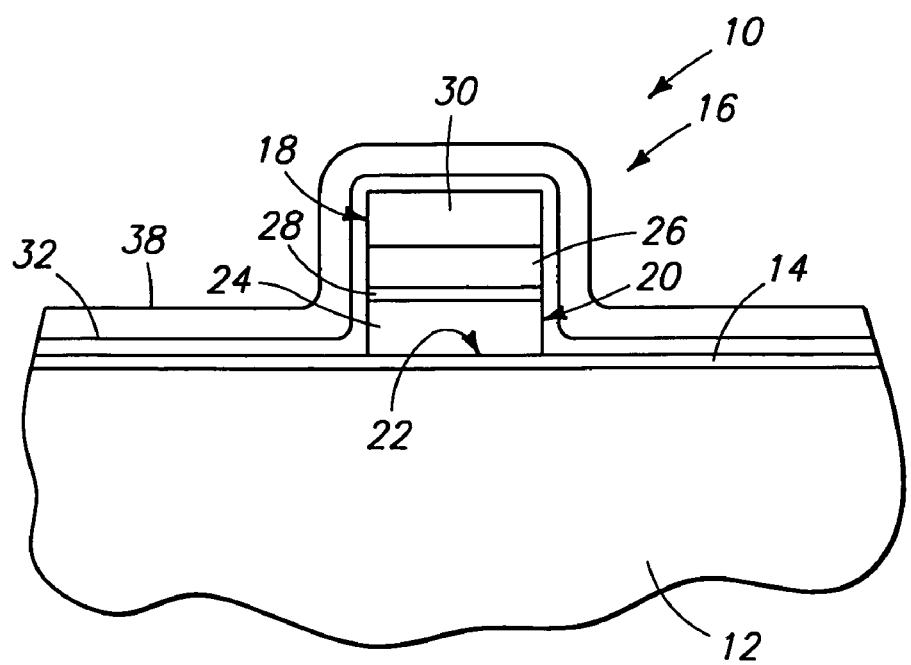
FIG. 6 is a view of the FIG. 1 substrate fragment at a processing step subsequent to that shown by FIG. 2 in accordance with an alternate preferred embodiment of the invention.

Referring to FIG. 6, another preferred aspect of the invention is set forth in which the smiling gate oxidation step takes place after contemporaneous formation of the first and second oxidation barriers. Specifically, first and second barrier materials or layers 32, 38 are deposited over gate stack 16 as shown without anisotropic etch of layer 32 prior to provision of layer 38. Preferably, the respective thickness of such layers are 100 Angstroms (layer 32) and 500 Angstroms (layer 38).

Figure 7:
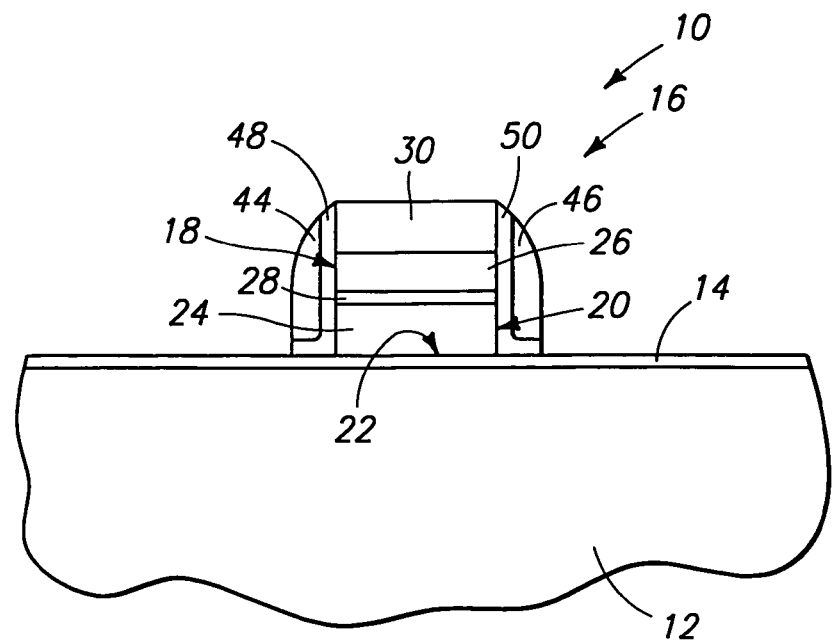
FIG. 7 is a view of the FIG. 1 substrate fragment at a processing step subsequent to that shown by FIG. 6.

Referring to FIG. 7, an anisotropic etch, preferably a reactive ion etch of first and second barrier materials 32, 38 is conducted to a degree sufficient to leave oxidation barriers 44, 46 on or over gate stack 16. When oxidation barriers are formed according to this aspect of the present method, the resulting barriers or spacers have a construction which is somewhat different from that shown in FIG. 5. More specifically, first or inner spacers 48, 50 include a bottom portion which abuts dielectric layer 14 and extends laterally away from gate stack 16 forming an L-shape (spacer 50) or a reverse L-shape (spacer 48).

After gate line sidewalls 18, 20 have been suitably electrically insulated, substrate 12 is exposed to oxidizing conditions which are effective to oxidize at least a portion of gate line interface 22 as described above, thereby forming the desired smiling gate construction. The anisotropic etch which is conducted with reference to FIGS. 6 and 7, is a common step anisotropic etch which contemporaneously forms the desired spacers or barriers described above.

The preferred methods of forming the desired smiling gate structure include, first shielding the gate or gate line sidewalls or conductive portions thereof with a suitable shielding material, and then conducting a reoxidation step, such as a source/drain reoxidation step, which utilizes dielectric layer 14 as a suitable channeling layer or medium along and through which oxidants travel to reach first conductive layer 24 so as to oxidize a portion thereof and a portion of the substrate therebeneath. According to a preferred aspect the shielding step includes, in a separate step, forming cap 30 over the gate top to protect the gate top during oxidation exposure. The oxidation barriers, whether barriers 34, 36 (FIG. 3), barrier pairs 34/40, 36/42 (FIG. 5), or barrier pairs 44/48, 46/50 (FIG. 7), serve to protect, along with oxidation resistant cap 30, the transistor gate or gate line stack from being undesirably affected by the reoxidation step which creates the smiling gate construction. This is because during such reoxidation step, the materials utilized to form composite gate stack 16 are effectively encapsulated or covered with oxidation barriers and sealed. Such serves to protect against undesirable chemical reactions with the oxidants. Such chemical reactions, if allowed to take place, would undesirably erode or oxidize the gate stack materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor structure comprising:
   a dielectric layer on a substrate;
   a gate structure over the dielectric layer, the gate structure comprising:
      a polysilicon material layer;
      a conductive reaction barrier layer over the polysilicon material layer; and
      a metal layer over the conductive reaction barrier layer, the gate structure having a pair of sidewalls each comprising a polysilicon material surface and a metal-comprising surface;
   a non-oxide spacer directly against each of the sidewalls, the non-oxide spacer comprising a first non-oxide material and a second non-oxide material and covering an entirety of the polysilicon material surface and the metal-comprising surface; and
   an oxidized region of the polysilicon material adjacent the dielectric layer and each of the non-oxide spacers.

2. The construction of claim 1 wherein each of the oxidized regions consists of a bird's beak structures.

3. The construction of claim 1 wherein the second non-oxide material does not contact the dielectric layer.

4. The construction of claim 1 wherein the second non-oxide material joins the dielectric layer.

5. The construction of claim 1 wherein the second non-oxide material is a nitride material.

6. The construction of claim 1 wherein at least a portion of the first non-oxide material has a lateral thickness of greater than or equal to 100 Angstroms.

7. The construction of claim 1 wherein the gate structure further comprises a nitride cap material over the metal layer.

8. The construction of claim 1 wherein the metal layer comprises at least one of W and Mo.

9. The construction of claim 1 wherein the conductive reaction barrier layer comprises at least one of TiN and WN.

10. The construction of claim 1 wherein the first non-oxide material is $SiN_xO_y$.

11. The construction of claim 1 wherein the first non-oxide material is $Si_3N_4$.

12. The construction of claim 1 wherein the first non-oxide material is $SiN_xO_y$ and the second non-oxide material is a nitride material.

* * * * *